(12) United States Patent
Labonte et al.

(10) Patent No.: US 9,941,278 B2
(45) Date of Patent: Apr. 10, 2018

(54) METHOD AND APPARATUS FOR PLACING A GATE CONTACT INSIDE AN ACTIVE REGION OF A SEMICONDUCTOR

(71) Applicant: GLOBALFOUNDRIES Inc., Grand Cayman (KY)

(72) Inventors: Andre Labonte, Mechanicville, NY (US); Ruilong Xie, Schenectady, NY (US); Xunyuan Zhang, Albany, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/202,764

(22) Filed: Jul. 6, 2016

(65) Prior Publication Data

US 2018/0012887 A1 Jan. 11, 2018

(51) Int. Cl.
*H01L 23/522* (2006.01)
*H01L 27/088* (2006.01)
(Continued)

(52) U.S. Cl.
CPC .... *H01L 27/0886* (2013.01); *H01L 21/31053* (2013.01); *H01L 21/31111* (2013.01); *H01L 21/76802* (2013.01); *H01L 21/76889* (2013.01); *H01L 21/76897* (2013.01); *H01L 21/823431* (2013.01); *H01L 21/823475* (2013.01); *H01L 23/5226* (2013.01); *H01L 23/53209* (2013.01); *H01L 29/41791* (2013.01); *H01L 29/45* (2013.01); *H01L 29/665* (2013.01); *H01L 29/66795* (2013.01); *H01L 29/7851* (2013.01)

(58) Field of Classification Search
CPC ......... H01L 21/76802; H01L 21/76889; H01L 21/76897; H01L 21/823431; H01L 23/5226; H01L 23/53209; H01L 23/53257; H01L 29/41791; H01L 29/66795; H01L 29/785; H01L 29/7851; H01L 2029/7858
See application file for complete search history.

(56) References Cited

U.S. PATENT DOCUMENTS 9,431,296 B2   8/2016 Basker et al.
9,496,225 B1  11/2016 Adusumilli et al.
(Continued)

OTHER PUBLICATIONS

U.S. Appl. No. 15/202,817, filed Jul. 6, 2016, titled Method and Apparatus for Placing a Gate Contact Inside a Semiconductor Active Region Having High-K Dielectric Gate Caps.

*Primary Examiner* — Stephen W Smoot
(74) *Attorney, Agent, or Firm* — Heslin Rothenberg Farley & Mesiti P.C.; Stephen Scuderi

(57) ABSTRACT

A method provides a structure having a FinFET in an Rx region, the FinFET including a channel, source/drain (S/D) regions and a gate, the gate including gate metal. A cap is formed over the gate having a liner and a core. Trench silicide (TS) is disposed on sides of the gate. The TS is recessed to a level above a level of the gate and below a level of the core. The liner is etched to the level of the TS. An oxide layer is disposed over the structure. A CB trench is patterned into the oxide layer within the Rx region to expose the core at a shelf portion of the CB trench. The core is etched to extend the CB trench to a bottom at the gate metal. The shelf portion having a larger area than the bottom. The CB trench is metalized to form a CB contact.

20 Claims, 13 Drawing Sheets

(51) Int. Cl.
*H01L 29/66* (2006.01)
*H01L 29/45* (2006.01)
*H01L 21/311* (2006.01)
*H01L 21/3105* (2006.01)
*H01L 29/78* (2006.01)
*H01L 21/8234* (2006.01)
*H01L 23/532* (2006.01)
*H01L 21/768* (2006.01)
*H01L 29/417* (2006.01)

(56) References Cited

U.S. PATENT DOCUMENTS

| | | |
|---|---|---|
| 9,634,113 B2 * | 4/2017 | Rubin .................. H01L 29/665 |
| 2016/0013104 A1 | 1/2016 | Hung et al. |
| 2016/0359009 A1 | 12/2016 | Xie et al. |
| 2016/0365424 A1 | 12/2016 | Basker et al. |
| 2017/0047250 A1 | 2/2017 | Leobandung et al. |
| 2017/0047253 A1 * | 2/2017 | Park .................. H01L 21/76897 |
| 2017/0053997 A1 | 2/2017 | Cheng et al. |
| 2017/0110549 A1 | 4/2017 | Xie et al. |
| 2017/0125530 A1 | 5/2017 | Zhang et al. |
| 2017/0256444 A1 * | 9/2017 | Chang ............... H01L 21/76834 |
| 2017/0301773 A1 * | 10/2017 | Park .................. H01L 29/66545 |
| 2018/0012798 A1 | 1/2018 | Labonte et al. |

* cited by examiner

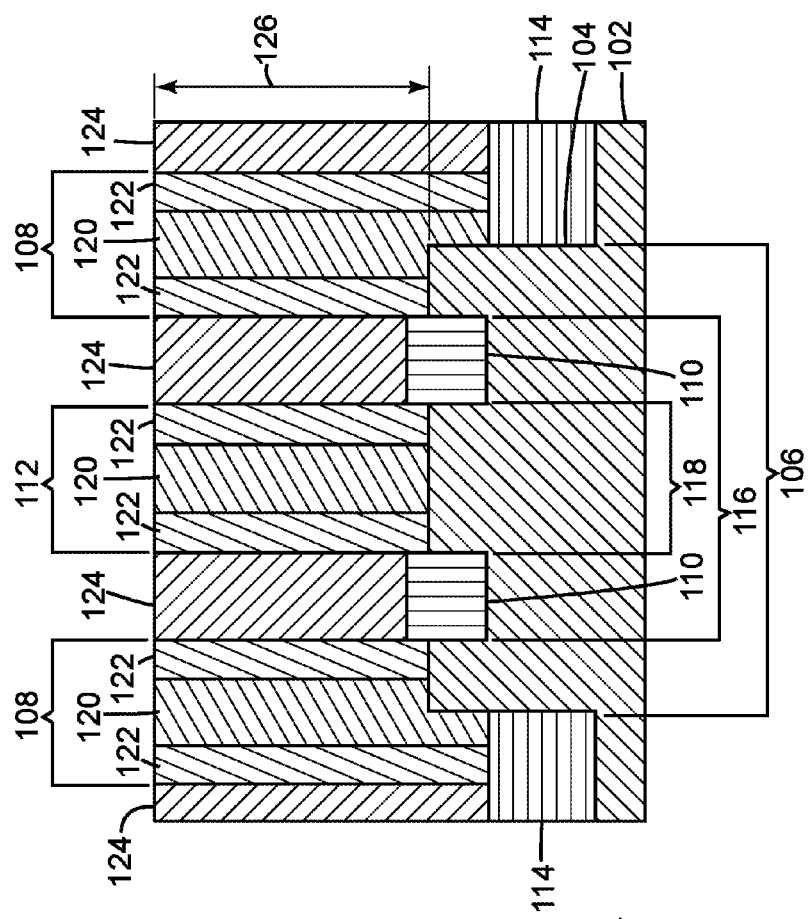
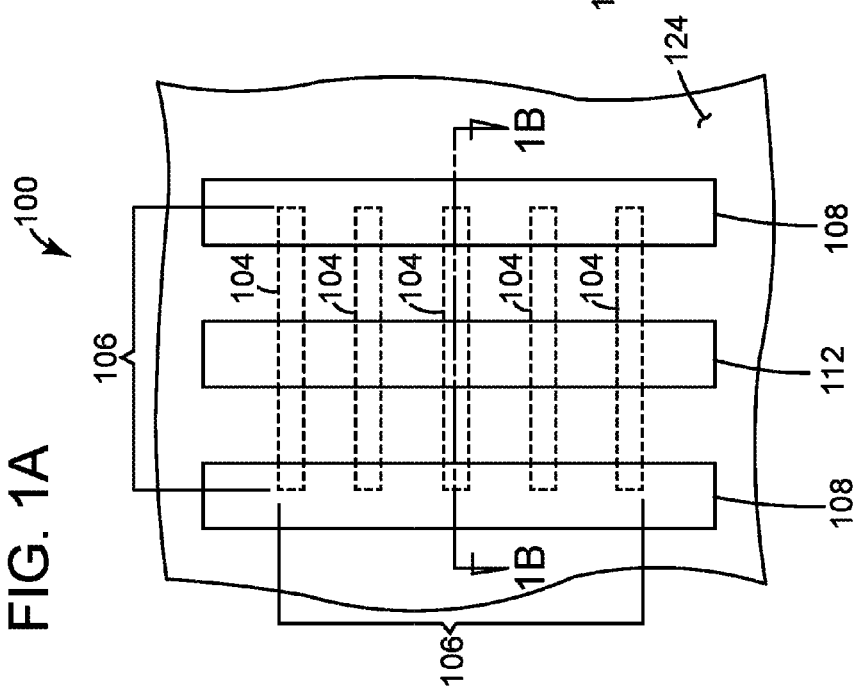

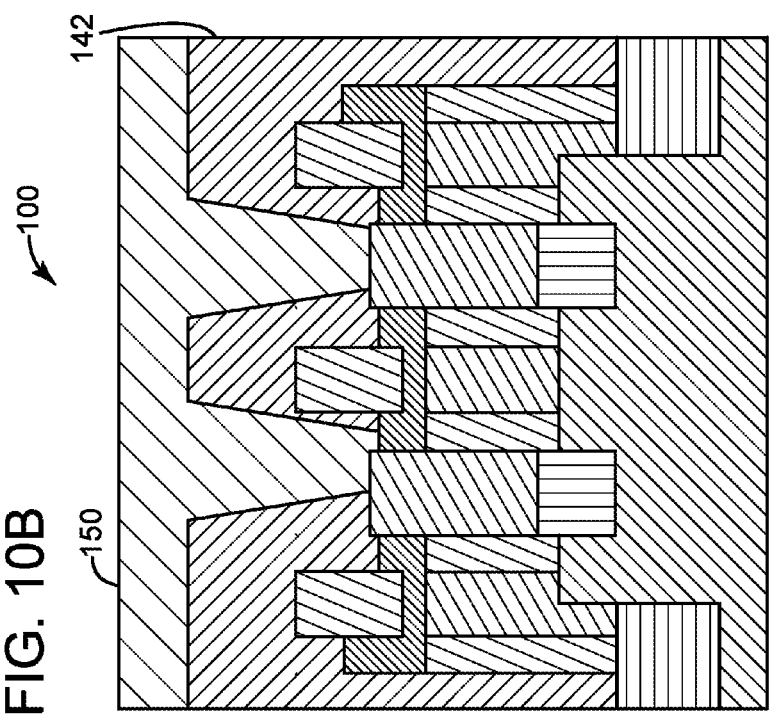
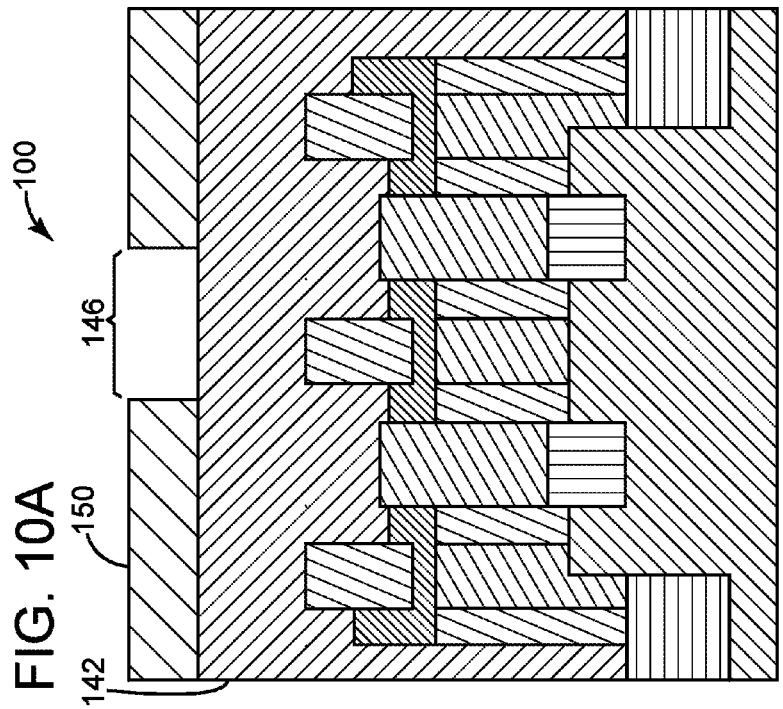

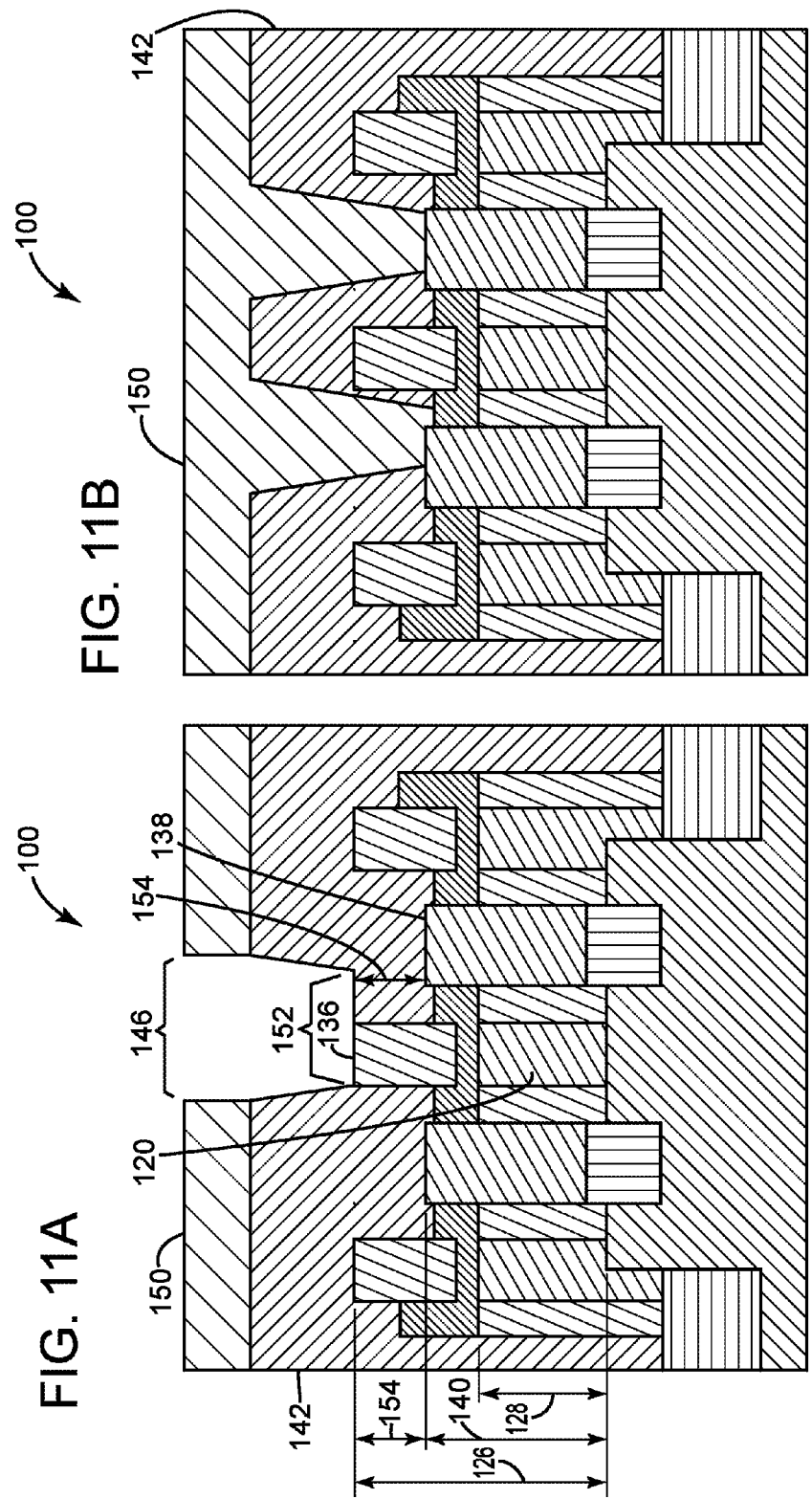

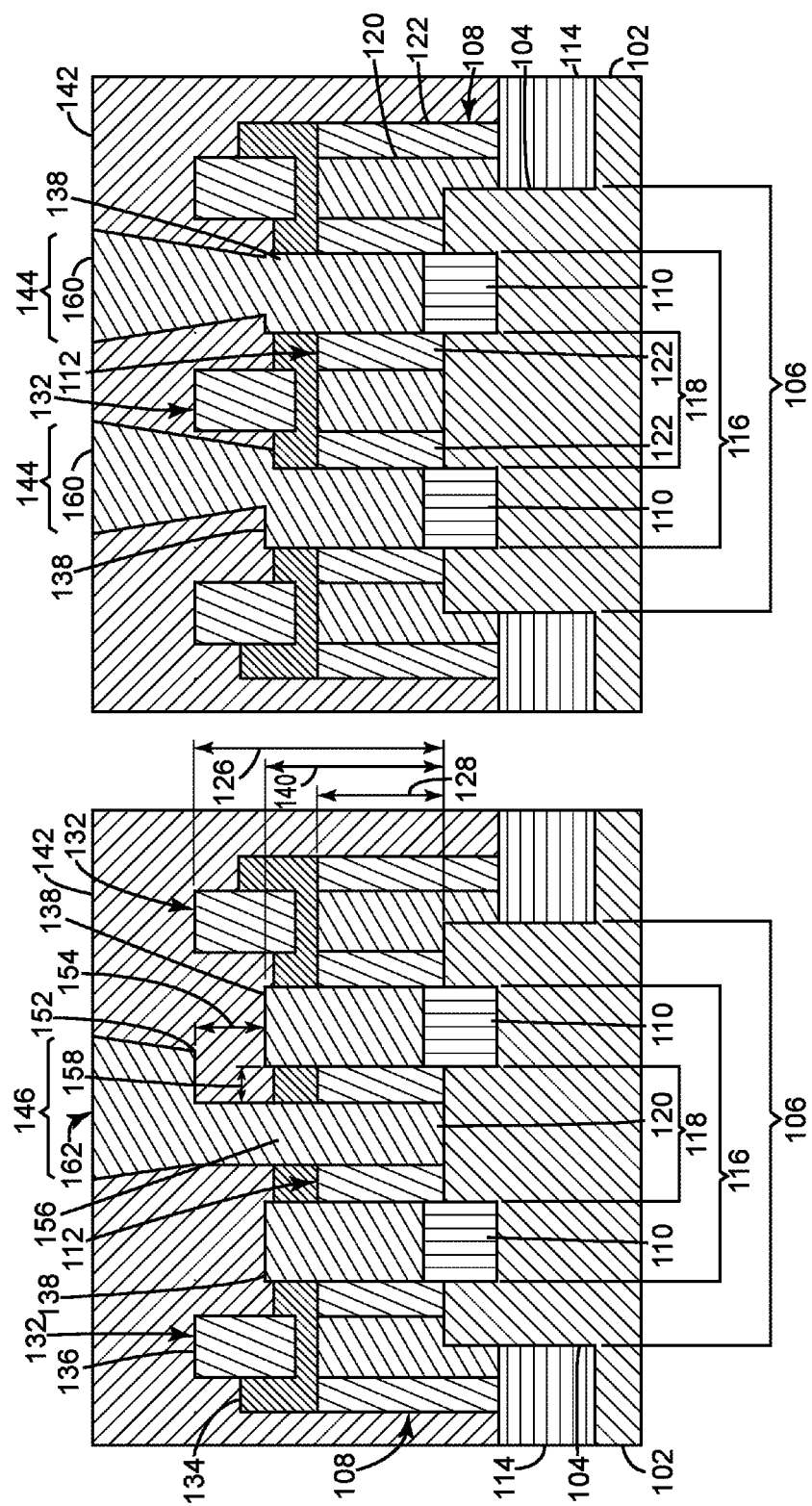

US 9,941,278 B2

METHOD AND APPARATUS FOR PLACING A GATE CONTACT INSIDE AN ACTIVE REGION OF A SEMICONDUCTOR

TECHNICAL FIELD

The present invention relates to semiconductor devices and methods of fabricating the same. More specifically, the invention relates to a method and apparatus for placing a gate contact inside an active region of a semiconductor structure.

BACKGROUND

Prior art semiconductor technology (e.g., 40 nanometer (nm), 14 nm and beyond) currently has most gate (CB) contacts disposed on a portion of the gate structure that is located outside of any active (Rx) region and over an isolation region such as a shallow trench isolation (STI) region, a deep trench isolation region or the like. This is done to prevent the high risk of electrically shorting to source/drain (CA) contacts or to the underlying trench silicide (TS) layers.

The possibility of CB contacts shorting to the TS layers is especially problematic. This is due to the fact that the TS layers extend longitudinally across an entire Rx region in order to ensure proper electrical contact with the source/drains (S/D) of FinFETs in an array of fins even under worst case misalignment conditions. Therefore, even though the CA contacts can be located in a localized area of the Rx region sufficiently distant from the CB contact to prevent shorts, the TS layers cannot.

In prior art 10 nm technology and beyond, self-aligned contact (SAC) nitride caps over the gate electrode metal are utilized to prevent shorting between CA contacts and the gate metal. The SAC caps are composed of a single material, typically silicon nitride (SiN), that generally has the same or similar material composition as the gate spacers over which the SAC caps are disposed. Between the gate spacers and SAC cap, the gate metal is completely isolated from the TS regions. With such caps, it is possible to do a deep TS recess below the level of the gate metal in an attempt to avoid shorting to CB contacts potentially disposed in the Rx region.

Problematically though, there are limits as to how deep the TS layer can be recessed without unacceptably increasing the electrical resistance through the TS layer. Therefore, even with such a deep TS layer recess, the CB contacts disposed over the gates become too close to the recessed TS to be reliably manufactured.

Placing the CB contacts outside of the Rx region is a detriment to scaling, especially for the 10 nm technology nodes and beyond. Additionally, CB contacts disposed over the isolation regions have additional design requirements that become more problematic with down scaling. For example, the CB contacts over isolation regions must always be located between two Rx regions, must have a minimum spacing between the CB contact and the fins and the TS regions, and the like.

Accordingly, there is a need for a method and apparatus that enables the placement of CB contacts inside of Rx regions of semiconductor structures. Moreover, there is need for such method and apparatus to be reliably manufacturable.

BRIEF DESCRIPTION

The present invention offers advantages and alternatives over the prior art by providing a method and apparatus for placing a CB contact inside of an Rx region of a semiconductor structure. Moreover, the method and apparatus improves the scalability of the semiconductor structure and is readily manufacturable.

A method of placing a CB contact in an Rx region of a semiconductor structure in accordance with one or more aspects of the present inventions includes providing a structure having a FinFET disposed in an Rx region. The FinFET includes a channel disposed between a pair of source/drain (S/D) regions and a gate (CB) disposed over the channel. The gate includes gate metal disposed between gate spacers. A cap is formed over the gate, the cap having an outer liner disposed around an inner core. Trench silicide (TS) layers are formed on opposing sides of the gate over the S/D regions. The TS layers are recessed to a level above a level of the gate and below a level of the core. The liner is etched down to a level proximate the level of the TS layers. An oxide layer is disposed over the structure. A CB trench is patterned into the oxide layer to expose the core at a shelf portion of the CB trench. The CB trench is located within the Rx region. The core is etched to further extend the CB trench to a trench bottom and to expose the gate metal. The shelf portion of the CB trench has a larger area than the trench bottom. The CB trench is metallized to form a CB contact electrically connected to the gate metal.

In another aspect of the present invention a semiconductor structure includes a FinFET disposed in an Rx region. The FinFET includes a channel disposed between a pair of source/drain (S/D) regions and a gate disposed over the channel. The gate includes gate metal disposed between gate spacers. A cap, which includes a cap liner, is disposed over the gate and a cap core is disposed on the cap liner. The cap core extends upwards from the cap liner. Trench silicide (TS) layers are disposed on opposing sides of the gate over the S/D regions. The TS layers have a level above a level of the gate and below a level of the cap core. An oxide layer is disposed over the structure. A CB trench is disposed within the oxide layer and over the Rx region. The CB trench extends down to a trench shelf portion located at substantially the level of the cap core and further extends from the shelf portion to a trench bottom. The trench bottom includes the gate metal. The shelf portion of the CB trench has a larger area than the trench bottom. A CB contact is disposed within the CB trench and electrically connected to the gate metal.

DRAWINGS

The invention will be more fully understood from the following detailed description taken in conjunction with the accompanying drawings, in which:

FIG. 1A is an exemplary embodiment of a simplified top planar view of a semiconductor structure at an intermediate stage of manufacturing in accordance with the present invention;

FIG. 1B is a simplified cross-sectional view of FIG. 1A taken along the line 1B-1B in accordance with the present invention;

FIG. 10A is a cross-sectional view of FIG. 9B having an organic planarization layer (OPL) disposed thereon and a CB trench disposed within the OPL in accordance with the present invention;

FIG. 10B is a cross-sectional view of FIG. 9C having an OPL disposed thereon in accordance with the present invention;

FIG. 11A is a cross-sectional view of FIG. 10A having the CB trench etched into the oxide layer in accordance with the present invention;

FIG. 11B is a cross-sectional view of FIG. 10B in accordance with the present invention;

FIG. 13A is a cross-sectional view of FIG. 12A having the CB trench metalized to form a CB contact in accordance with the present invention; and FIG. 13B is a cross-sectional view of FIG. 12B having the CA trenches metalized to form CA contacts in accordance with the present invention.

DETAILED DESCRIPTION

Figure 2:
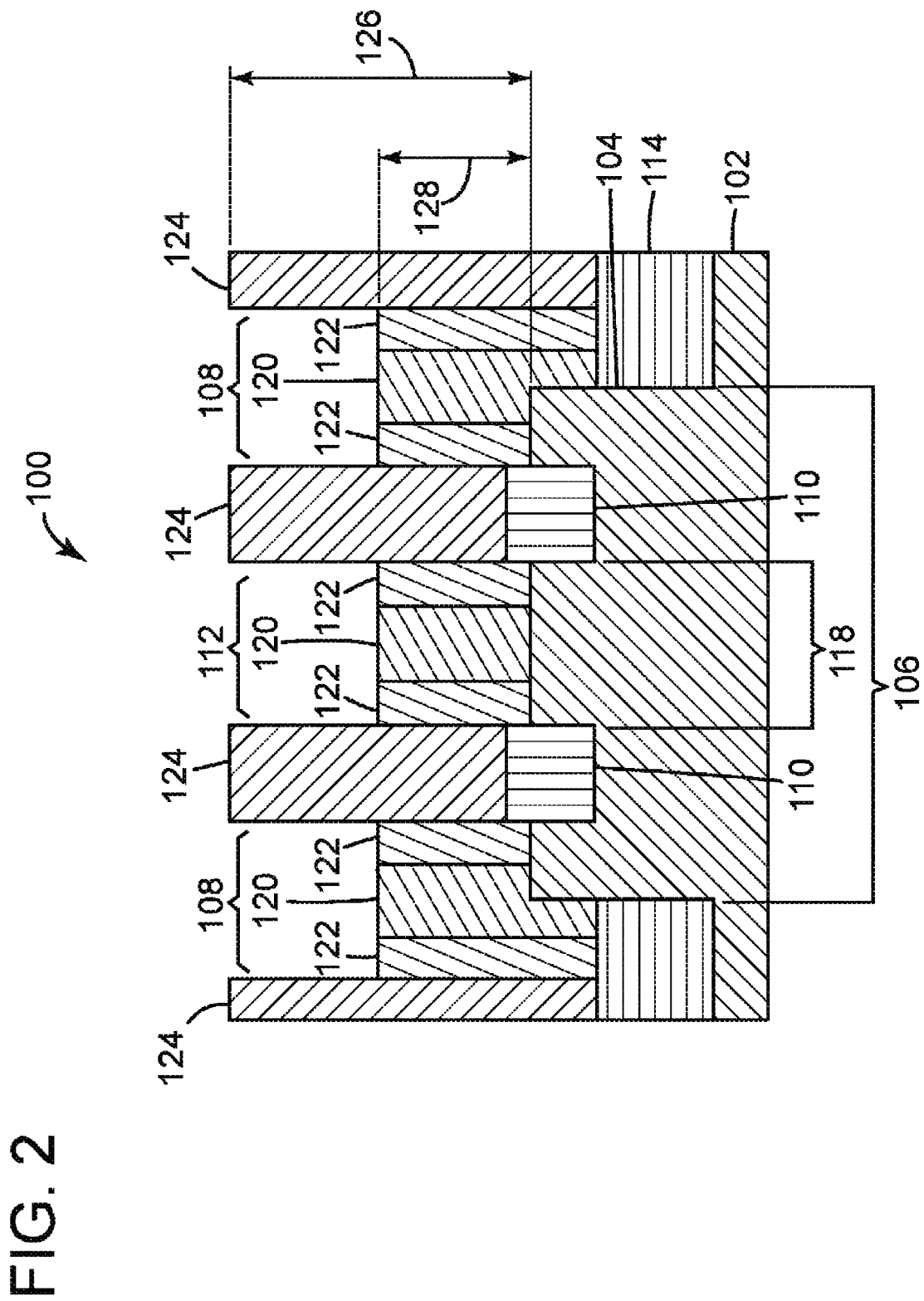
FIG. 2 is a cross-sectional view of FIG. 1B after having a gate recessed in accordance with the present invention.

Certain exemplary embodiments will now be described to provide an overall understanding of the principles of the structure, function, manufacture, and use of the methods, systems, and devices disclosed herein. One or more examples of these embodiments are illustrated in the accompanying drawings. Those skilled in the art will understand that the methods, systems, and devices specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present invention.

FIGS. 1A-13B illustrate various exemplary embodiments of a method and apparatus for placing a gate (CB) contact inside of an active (Rx) region of a semiconductor structure in accordance with the present invention.

Referring to FIGS. 1A and 1B, an exemplary embodiment of a simplified top planar view and a simplified cross-sectional view taken along the line 1B-1B of a semiconductor structure 100 in accordance with the present invention is presented at an intermediate stage of manufacturing. At this stage of the process flow, semiconductor structure 100 includes a substrate 102 having fins 104, which extend vertically upward from the substrate 102 and horizontally across the substrate to define an active (Rx) region 106 of the substrate 100. Fins 104 are disposed in a parallel array of fins (best seen in FIG. 1A) extending across the Rx region 106 of the substrate 102. The fins 104 are terminated by dummy gates 108, which extend laterally across the distal ends of the fins 104 at the edges of the Rx region 106. The dummy gates 108 are used to induce symmetrical epitaxial growth of source/drain (S/D) regions 110 on the portions of the fins 104 located between the dummy gates 108 and adjacent active gates 112.

Though only one active gate 112 is illustrated, gate 112 may be a plurality of active gates 112 (e.g., from a few to many thousands and more) that are disposed along fins 104 within the active region 106. Gates 112 extend generally perpendicular to fins 104 within the Rx region 106 and may also extend substantially into an isolation region 114. Additionally, though only two S/D regions 110 are shown, there typically are S/D regions 110 that are epitaxially grown into fins 104 between each of the many gates 112 within the Rx region 106 and between the active gates 112 and the dummy gates 108 at the boarders of the Rx region 106.

Bordering the Rx region 106 is the isolation region 114, such as a shallow trench isolation (STI) region, a deep trench isolation region or the like, that is used to separate the Rx region 106 from various other active regions (not shown) on semiconductor structure 100. Isolation region 114 is typically composed of an amorphous dielectric material, such as a flowable oxide (FOX) or the like.

A Fin Field Effect Transistor (FinFET) 116 is disposed within the fin 104 of the Rx region 106. The FinFET 116 includes the pair of S/D regions 110 and a channel 118 disposed therebetween. The gate 112 is disposed over the channel 118 and is operable to control electrical continuity through the channel 118 and between the S/D regions 110. The gate 112 includes gate metal (or gate metal stack) 120 disposed between a pair of gate spacers 122. Note that the dummy gates 108 have the exact structure as the active gates 112 except that the dummy gates are not disposed over an active channel 118 and extend partially into the isolation region 114 where there are no active devices.

The gate spacers 122 are composed of a dielectric material such as SiN, SiBCN or similar. For this particular exemplary embodiment, the gate spacers 122 are SiBCN.

The gate metal 120 is typically a stack of gate metals, which generally includes three main groups of structures (not shown). Those three main structures are: the gate dielectric layers (typically a high-k dielectric material), the work-function metal structures (typically TiN, TaN, TiCAl, other metal-nitrides or similar materials) and the gate electrode metal (typically Al, W, Cu or similar metal). The gate dielectric layers are used to electrically insulate the work-function metal structures and the gate electrodes from the substrate. The work-function metal structures are generally metal-nitrides that provide the work-function needed for proper FinFET operation, but typically have 10 to 100 times larger resistivity than the gate electrodes. The gate electrodes are metals with a very low resistivity.

Disposed over the S/D regions 114 and between the gates 112 and dummy gates 108 is an inter-layer dielectric (ILD) 124, which is typically composed of an oxide such as SiO2. The ILD 124 extends upwards from the fins 104 to a first level (i.e., height) 126 above the tops of the fins 104. The first level being substantially equal to the heights of the gates 112 and the ILD 124 at this stage of the process flow.

Referring to FIG. 2, the gates 108, 112 are next recessed down to a second level or gate level 128. That second gate level 128 being the final level (or height) of the gates 108, 112 above the fins 104 in the fully processed structure 100 (best seen in FIGS. 13A and 13B). The gate spacers 122 and gate metal 120 can be recessed in two separate anisotropic etching processes, such as two reactive ion etch (RIE) processes or similar.

Figure 3:
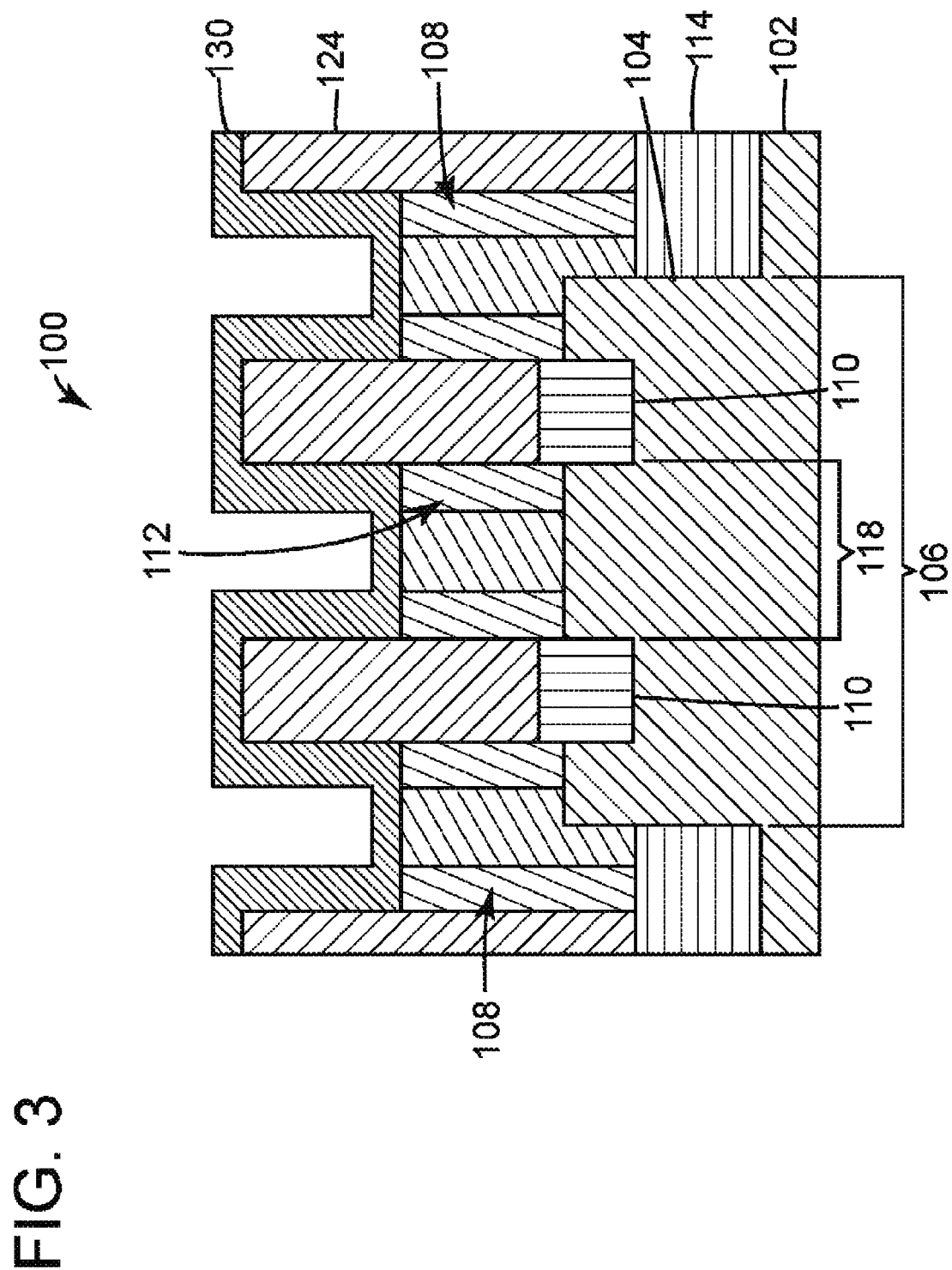
FIG. 3 is a cross-sectional view of FIG. 2 with a liner layer disposed thereon in accordance with the present invention.

Referring to FIG. 3, a liner layer 130 is disposed over the structure 100. The liner layer can be generally conformally coated over the exposed surfaces of the ILD 124 and gates 108, 112 through such processes as atomic layer deposition (ALD) or similar. The liner layer is generally a dielectric having a first material composition such as SiN or the like. For this particular exemplary embodiment, the liner layer is SiN.

Figure 4:
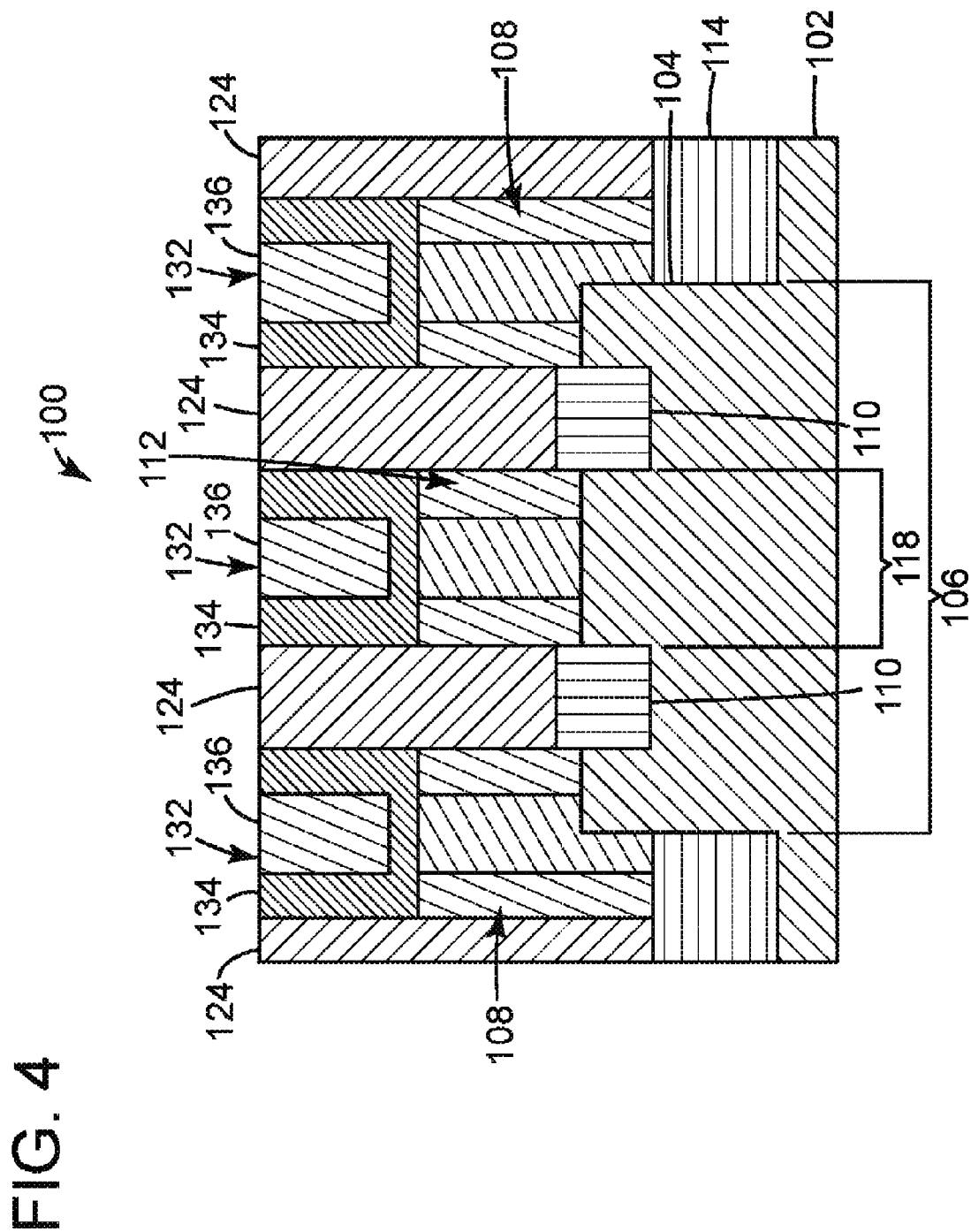
FIG. 4 is a cross-sectional view of FIG. 3 with a cap formed thereon in accordance with the present invention.

Referring to FIG. 4, next a core layer is disposed over liner layer 130 by such means as chemical vapor deposition (CVD), physical vapor deposition (PVD), ALD or the like. The core layer is also generally a dielectric having a second material composition that is different from the first material composition of the liner layer 130. For example, the core layer may be composed of SiBCN, SiCO or similar. For this particular exemplary embodiment, the core layer is SiBCN, which is the same material as the spacers 122.

The core layer and liner layer 130 are then planarized down (such as by chemical mechanical planarization (CMP)) to expose the top surfaces of the ILD 124 and to form a cap 132 over the gates 108, 112. The cap 132 has an outer liner 134 disposed around an inner core 136. The outer liner 134 is formed from that portion of the liner layer 130 which remained after planarization. The inner core 136 is formed from that portion of the core layer which remained after planarization.

Figure 5:
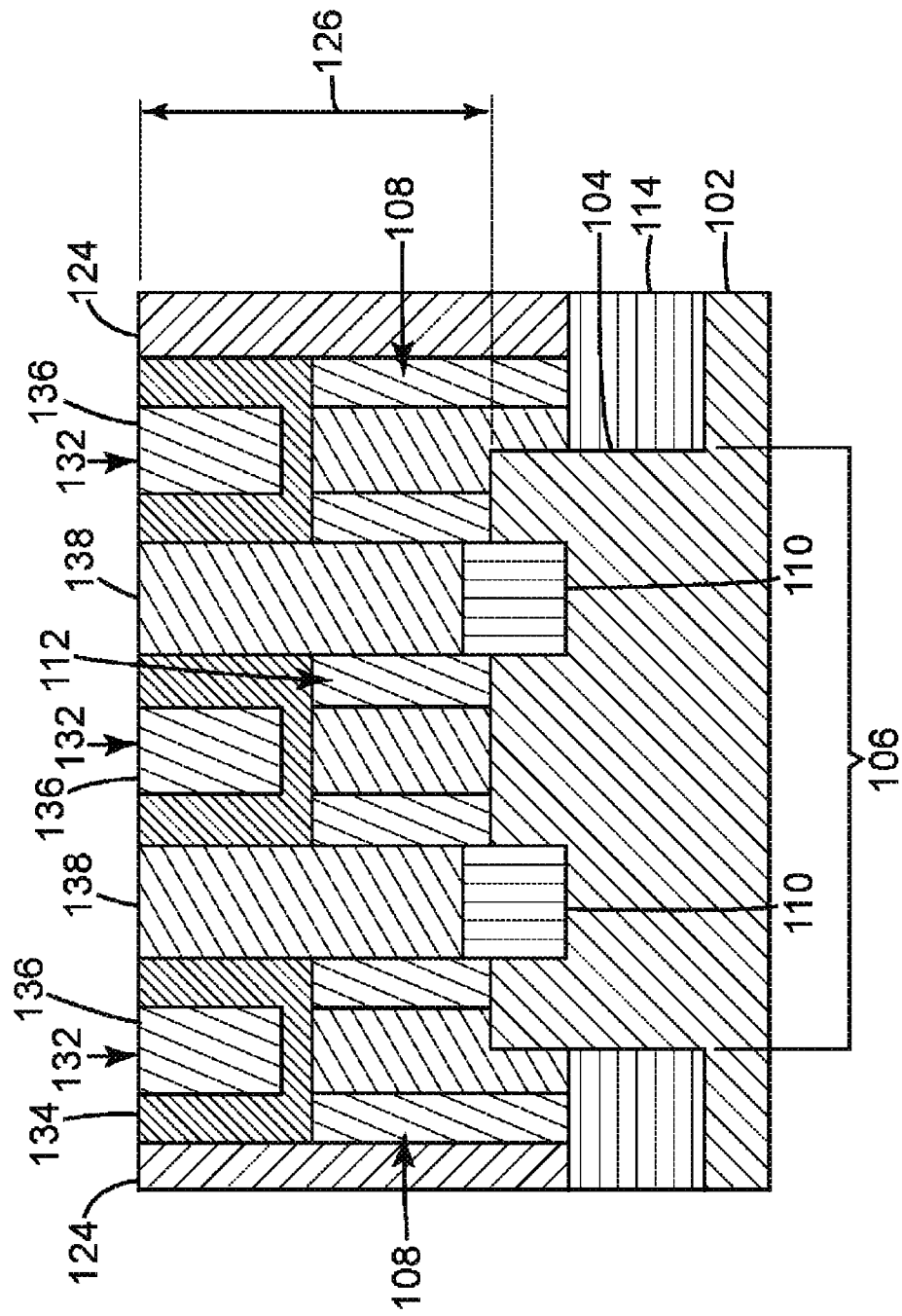
FIG. 5 is a cross-sectional view of FIG. 4 with TS layers disposed thereon in accordance with the present invention.

Referring to FIG. 5, TS trenches (not shown) are formed by removing the ILD layer 124 from between the gates 108, 112 in the Rx region 106 of structure 100 by well-known processes such as by an anisotropic dry etching process. For example, the TS trenches may be patterned by a conventional lithographic process with a TS mask, followed by a plasma dry etch. The plasma etch is self-aligned in nature, wherein the etch process only removes the oxide ILD layer 124 and is selective to the nitride gate cap 132 and spacers 122. TS layers 138 are then formed within the TS trenches.

The TS layers 138 are disposed on opposing sides of the gates 108, 112 and over the S/D regions 110 in place of the ILD layer 124. The TS layers 138 may be disposed by a process of TS metallization. The TS metallization process may include formation of a bottom slicide layer over the S/D regions 110 followed by deposition of a top conducting metal layer. The bottom silicide layer may be composed of Ni, Ti, NiPt silicide or the like. The conducting metal layer may be composed of TiN, TaN and bulk conducting materials such as W, Co or Ru.

Any overfill of the TS layers 138 is planarized down to the first level 126, which is now the level (or height) of the top of the core 136 (and cap 132) above the top surface of the fin 104. TS layers 138 extend longitudinally across the entire Rx region 106 in order to ensure proper electrical contact with the S/D regions 110 in the array of fins 104 even under worst case misalignment conditions.

Figure 6:
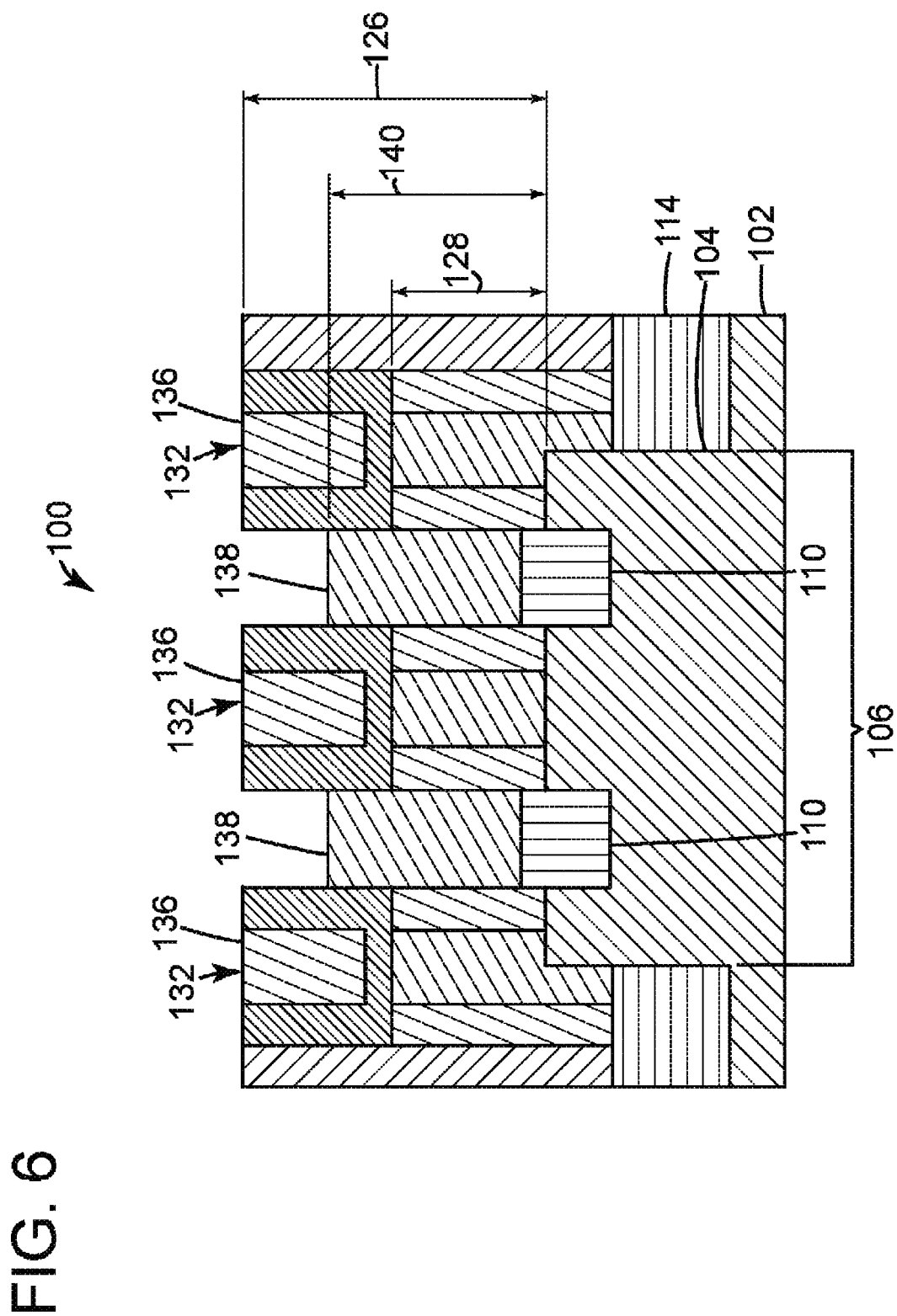
FIG. 6 is a cross-sectional view of FIG. 5 with the TS layers recessed in accordance with the present invention.

Referring to FIG. 6, the TS layers 138 are then recessed to a third level 140 that is above the level 128 of the gates 108, 112 and below the level 126 of the core 132. The recess can be accomplished by a timed anisotropic etch of the TS layer, such as by reactive ion etching (RIE) or similar.

It is important to note that this recess of TS layers 138 is shallow compared to prior art methods of forming a CB contact in the Rx regions. In those prior art methods, the TS layers are recessed well below the level 128 of the gates 108, 112. In the present embodiment, the TS layers 138 are typically recessed within a range of 15 to 30 nm, which is typically about 25 to 50 percent of the height of the original TS layers. However, prior art methods of forming CB contacts in Rx regions recess the TS layers as much as reasonably possible without excessively increasing the overall resistance of the TS layers. Accordingly, the prior art methods recess the TS layers well below 50 percent of the original height of the TS layers and well below the level 128 of the gates 108, 112.

Figure 7:
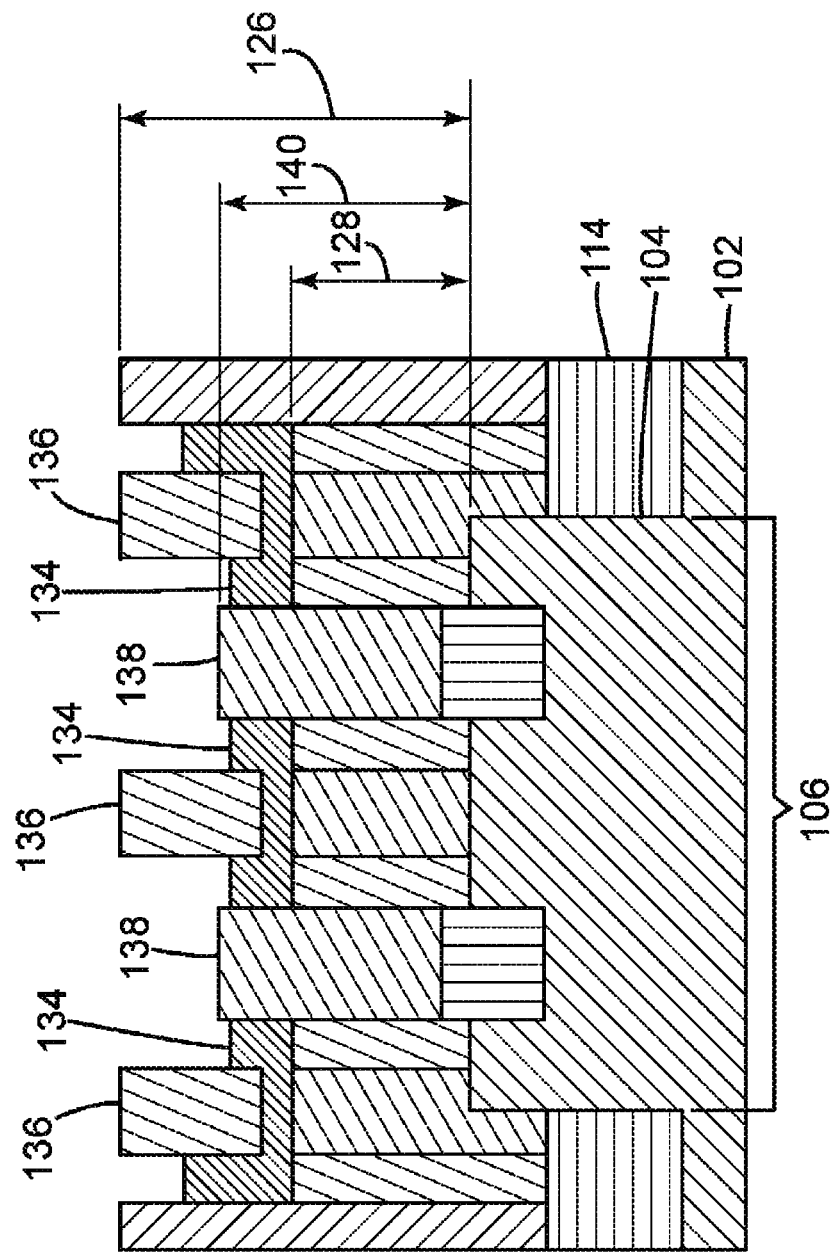
FIG. 7 is a cross-sectional view of FIG. 6 with a cap liner recessed in accordance with the present invention.

Referring to FIG. 7, the liner 134 is etched down to a level that is proximate the level of the TS layers 138, i.e., the third level 140. This can be accomplished with a wet etching process such as HFEG or similar. More specifically, if the core 136 is composed of SiBCN and the liner 134 is composed of SiN, then HFEG is typically used to etch down the liner. Alternatively, if the core 136 is composed of SiCO then a plasma dry etch is more typically used to etch down the SiN liner. The core 136 is left intact at the first level or core level 126.

Note that in this embodiment, the liner 134 is composed of SiN and the core is composed of SiBCN. The wet etch process is used to recess the liner because the etching process must be selective between the liner 134 material (SiN), the core 132 material (SiBCN) and the TS layer 138 material (for example, tungsten).

As will be explained in greater detail herein, the liner 134 must be etched below the level 126 of the core 136, because the core alone must subsequently be anisotropically dry etched away to connect the gate metal 120 to a CB contact 162 (best seen in FIG. 13A). Since anisotropic dry etch behavior between SiN and SiBCN is very similar, showing no obvious selectivity between each other, then if the core 136 and liner 134 were at the same level during a typical dry etch process, both would be etched away causing a short between the TS layer 138 and the gate metal 120.

Figure 8:
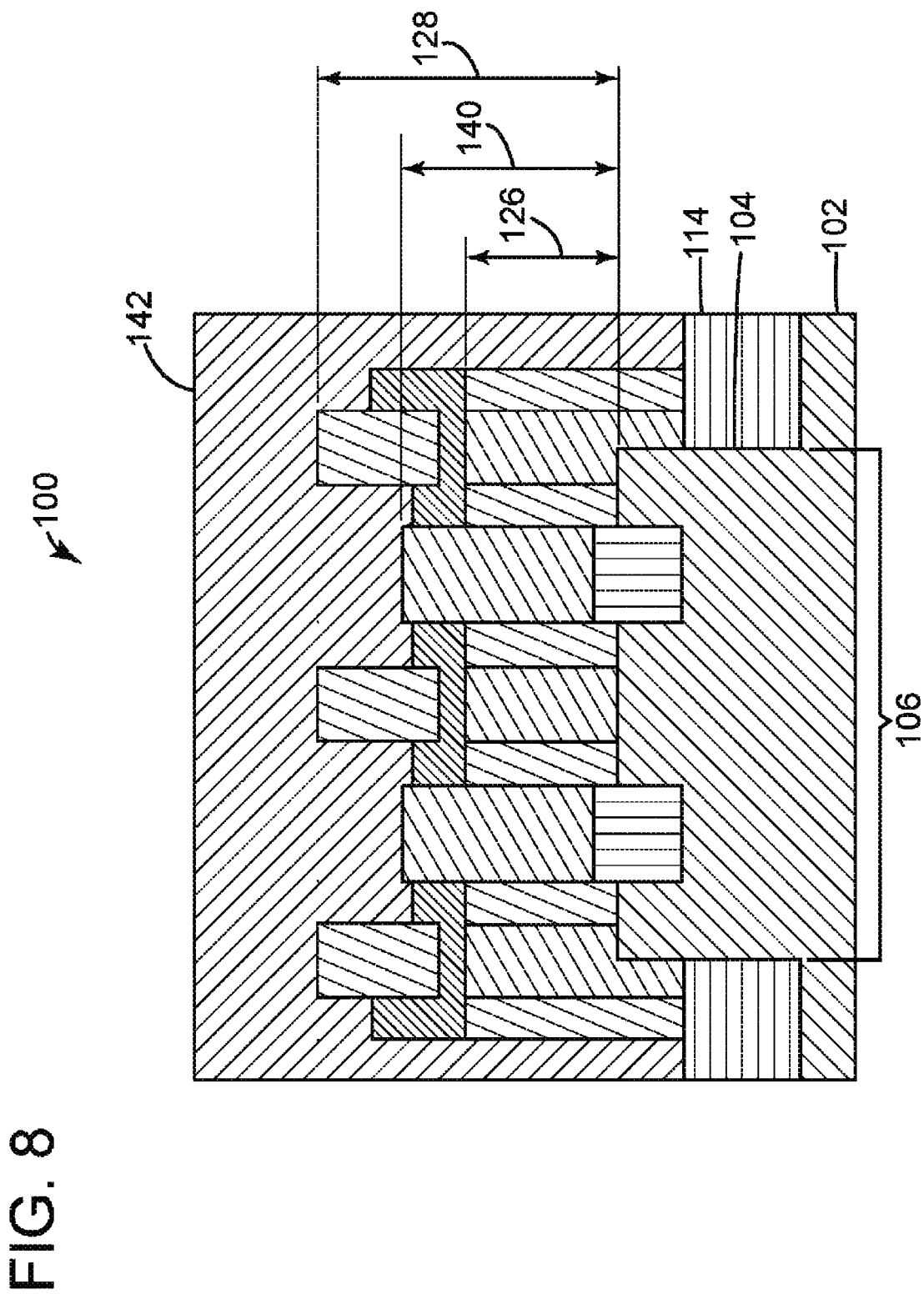
FIG. 8 is a cross-sectional view of FIG. 7 with an oxide layer disposed thereon in accordance with the present invention.

Referring to FIG. 8, an oxide fill layer (or oxide layer) 142 is disposed over the structure 100. The oxide fill layer 142 will be used for subsequent patterning of a CB trench (best seen in FIG. 12A) and CA trenches (best seen in FIG. 9C)

Figure 9A:
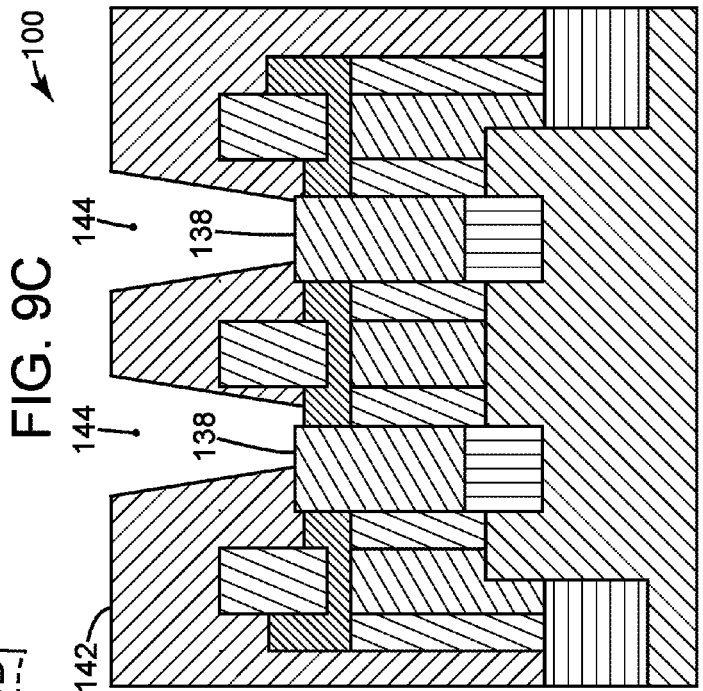
FIG. 9A is a top planar view of FIG. 8 showing the features of structure 100 that underlay the oxide layer (represented as a phantom-lined boundary), wherein a pair of CA trenches are disposed in the oxide layer and a dotted line perimeter represents the targeted location of a yet to be formed CB trench in the oxide layer in accordance with the present invention.
Figure 9B:
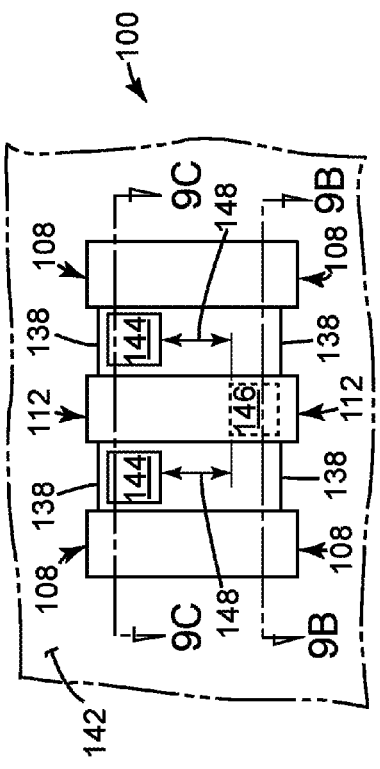
FIG. 9B is a simplified cross-sectional view of FIG. 9A taken along the line 9B-9B in accordance with the present invention.
Figure 9C:
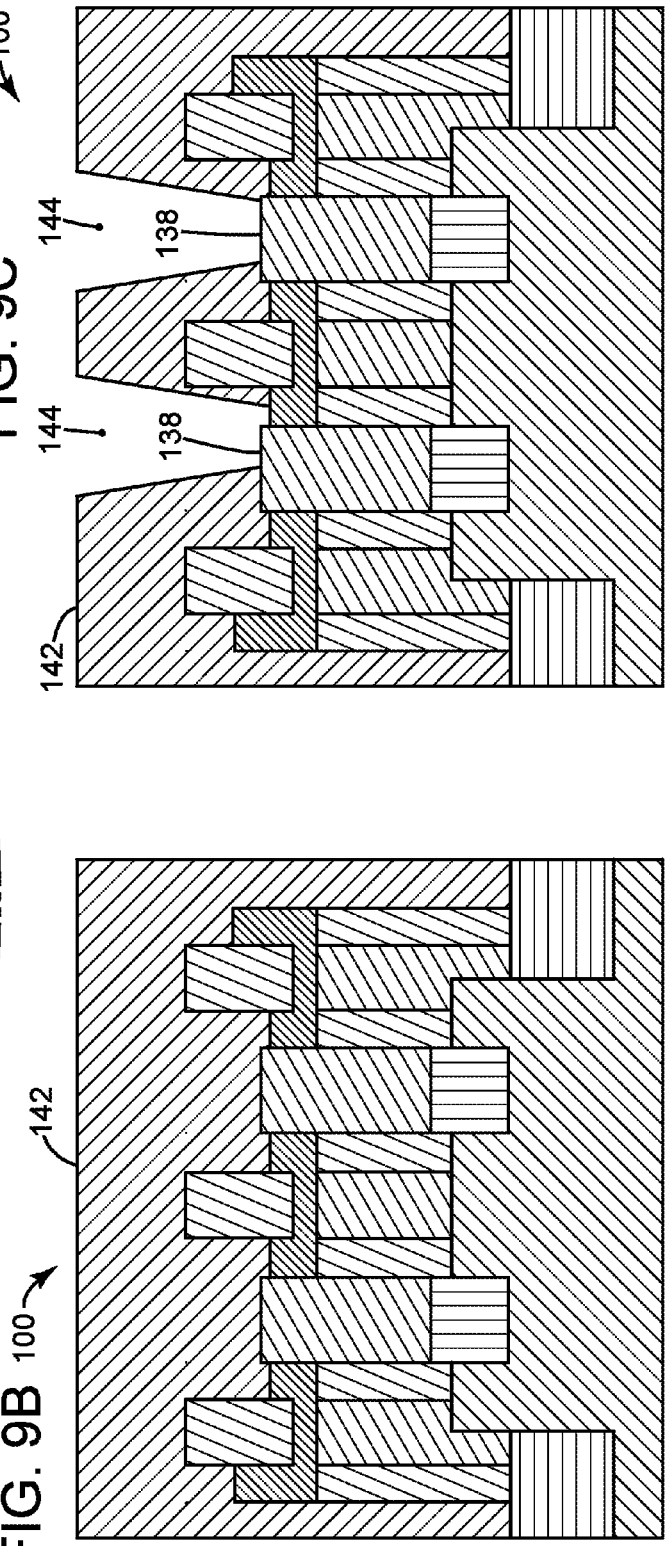
FIG. 9C is a simplified cross-sectional view of FIG. 9A taken along the line 9C-9C in accordance with the present invention.

Referring to FIGS. 9A, 9B and 9C, a pair of CA trenches 144 (best seen in FIG. 9C) are patterned into the oxide fill layer 142 to expose the TS layers 138 thereunder. Later in the process flow, the CA trenches will be metalized to form a pair of CA contacts 160 (best seen in FIG. 13B) that are electrically connected to the TS layers 138. The CA trenches 144 may be anisotropically etched as by a RIE process or similar. Cross-sectional view 9B shows the location of where a yet to be formed CB trench 146 will also be patterned and metalized to form a CB contact 162 (best seen in FIG. 13A).

For clarity purposes, top planar view of FIG. 9A shows the features of structure 100 that underlay the oxide layer 142, wherein the oxide layer 142 is represented as a phantom-lined boundary. Additionally, a dotted line perimeter of CB trench 146 is shown in the top planar view 9A and represents the targeted location of the CB trench 146 that will be disposed into the oxide fill layer 142 in subsequent process steps.

It is important to note that the CA trenches 144 and CB trench 146 must be located a sufficient distance 148 apart in a direction that is parallel to the gate 112 to substantially prevent electrical shorting between the CB contact 162 and CA contacts 160 (best seen in FIG. 13B). The distance 148 must take into consideration worst case misalignment tolerances due to unavoidable manufacturing variations and still be able to prevent such shorting. Typically distance 148 would be within a range of 15 to 30 nm or greater, depending on the overall width of the Rx region.

Referring to FIGS. 10A and 10B, an organic planarization layer (OPL) 150 is next disposed over the structure 100. The CB trench 146 is then patterned and etched into the OPL layer 150 by such processes as a RIE etch or similar. Though the process flow of this embodiment shows the CB trench 146 formed after the CA trenches, one skilled in the art would recognize that the CB trench may be formed first in the process flow.

Referring to FIGS. 11A and 11B, the CB trench 146 is patterned and etched further into the oxide layer 142 to expose the top surface of the core 136 at a shelf portion 152 of the CB trench 146. The etching process, again, may be a RIE process.

Note that the top surface of the core 136 is a part of the shelf portion 152. However, the core 136 has a much smaller surface area than that of the entire shelf portion 152. Typically, the shelf portion 152 has an area that is larger than the core 136 surface area. As a result, if the entire shelf portion 152 of CB trench 146 were to be etched down to the level of the gate 126 in order to expose the gate metal 120, the subsequent metallization of the CB trench 146 would cause a short to the TS layer 138.

Note also that the core 136 extends up a to a core level 126 that is a distance 154 above the level 140 of the TS layer 138, which is also the distance of the shelf portion above the TS layers. That distance 154 is predetermined to be a sufficient vertical distance of the shelf portion 152 from any TS layers 138 to substantially prevent electrical shorting between the any metal disposed upon the shelf portion and any TS layers within the Rx region 106.

The distance 154 must take into consideration worst case misalignment and other tolerances due to unavoidable manufacturing variations and still be able to prevent such shorting. Typically distance 154 would be within a range of 10 to 30 nm.

Figure 12A:
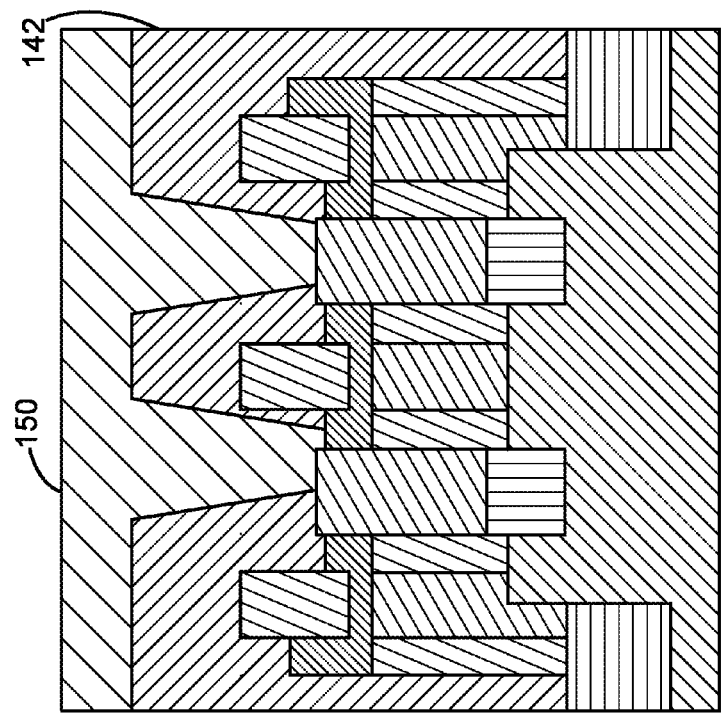
FIG. 12A is a cross-sectional view of FIG. 11A having the CB trench etched down to gate metal of the gate in accordance with the present invention.
Figure 12B:
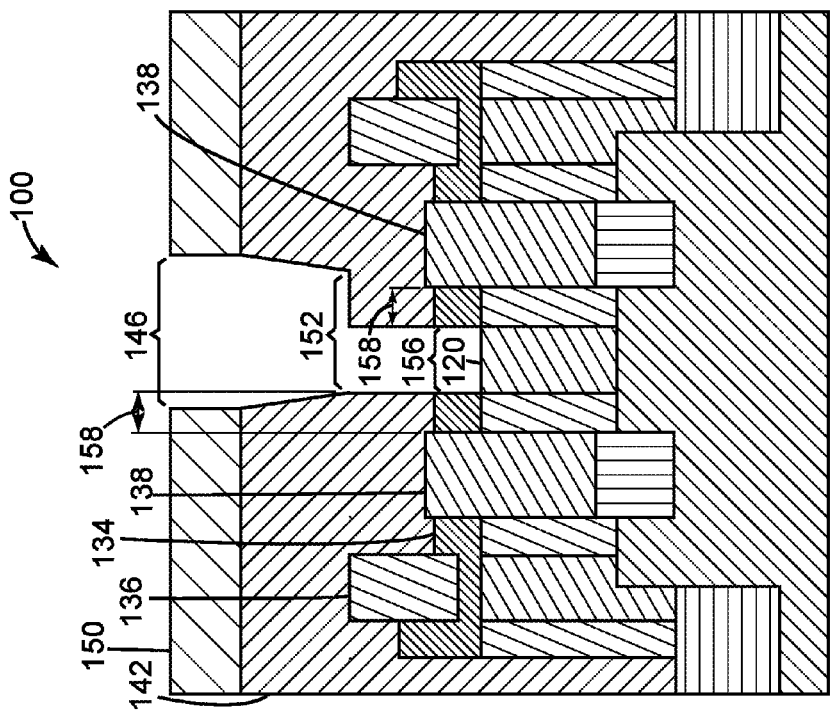
FIG. 12B is a cross-sectional view of FIG. 11B in accordance with the present invention.

Referring to FIGS. 12A and 12B, the core 136 is next anisotropically etched away by, for example, a RIE process. The anisotropic etch, in this embodiment, is selective to the oxide material of ILD 124, but not selective between the SiN material of the core 136 and the SiBCN material of the liner 134, therefore the etch process will punch through the core and the underlying liner to expose the gate metal 120. Accordingly, the CB trench is further extended by the etch process to a trench bottom 156 to expose the gate metal 120.

The trench bottom 156 is substantially the same area and cross-sectional shape of the etched away core 136. As such, the shelf portion 152 of the CB trench 146 has a larger area than the trench bottom 156. Typically, the shelf portion 152 has an area that is more than 50% larger than the trench bottom 156.

Note that it was important the liner 134 was previously recessed (as best illustrated in FIG. 7) prior to forming the shelf portion 152. This is because both the liner 134 and core 136 would have been exposed to the anisotropic etching of the shelf portion 152 to form the trench bottom 156 if the liner 134 had not been recessed. As such the trench bottom 156 would have been substantially equal in area to the shelf portion 152 and the metalized CB trench (i.e., the CB contact 162) would have shorted with the TS layers 138.

The trench bottom 156 is spaced a predetermined sufficient distance 158 away from the TS layers 138 to substantially prevent electrical shorting between the CB contact 162 disposed within the trench bottom 156 and the TS layers 138. The distance 158 must take into consideration worst case misalignment and other tolerances due to unavoidable manufacturing variations and still be able to prevent such shorting. That distance 158 is determined by a thickness of the liner layer 130 and is typically within a range of 5-20 nm.

Referring to FIGS. 13A and 13B, the OPL layer is 150 is stripped away as, for example, by wet etch process or similar. Then the CA trenches 144 and CB trench 146 are metalized as, for example, by CVD, PVD, electroless metal plating or similar, to form CA contacts 160 in the CA trenches 144 and a CB contact 162 in the CB trench 146. The CB contact 162 is electrically connected to the gate metal 120 and the CA contacts 160 are electrically connected to the TS layers 138.

At this final stage of the process flow, the finished semiconductor structure 100 now includes the FinFET 116 disposed in the Rx region 106. The FinFET 116 includes the channel 118 disposed between the pair of source/drain (S/D) regions 110 and the gate 112 disposed over the channel 118. The gate 112 includes the gate metal 120 disposed between the gate spacers 122. The cap 132 includes the cap liner 134 disposed over the gate 112 and the cap core 136 disposed on the cap liner 134. The cap core 136 extends upwards from the cap liner 134. The trench silicide (TS) layers 138 are disposed on opposing sides of the gate 112 over the S/D regions 110. The TS layers 138 have a level 140 above a level 128 of the gate 112 and below a level 126 of the cap core 136. The oxide layer 142 is disposed over the structure 100. The CB trench 146 is disposed within the oxide layer 142 and over the Rx region 106. The CB trench 146 extends down to the trench shelf portion 152 located at substantially the level 126 of the cap core 136 and further extends from the shelf portion 152 to the trench bottom 156. The trench bottom includes the gate metal 120. The shelf portion 152 of the CB trench 146 has a larger area than the trench bottom 156. The CB contact 162 is disposed within the CB trench 146 and is electrically connected to the gate metal 120.

Additionally the semiconductor structure 100 now includes the pair of source/drain (CA) contacts 160 for the FinFET 116, which are also disposed within oxide layer 142. The CA contacts electrically connect to the TS layers 138, which overlay the S/D regions 110 of the FinFET 116. The CA contacts 160 are located a sufficient distance 148 (best seen in FIG. 9A) away from the CB contact 162 in a direction parallel to the gate 112 to substantially prevent electrical shorting between the CB contact 162 and the CA contacts 160.

Moreover, the Rx region 106 of the semiconductor structure 100 further includes a plurality of fins 104 (best seen in FIG. 1A) extending perpendicular to the gate 112. A plurality of FinFETs 116 are disposed in the fins 104. Each FinFET 116 includes a channel 118 disposed between a pair of S/D regions 110, wherein the gate 112 is disposed over the channels 118 of each FinFET 116 and the TS layers 138 are disposed on opposing sides of the gate 112 over the S/D regions 110 of each FinFET 116.

Advantageously, both CA contacts 160 and CB contacts 162 are disposed within the Rx region 106 of structure 100 and are spaced a sufficient distance away from any TS layers 138, and from each other, to substantially prevent electrical shorting. The form and spacing of CA Contacts 160 and CB contact 162 take into consideration worst case misalignment and other tolerances due to unavoidable manufacturing variations to prevent such shorting. Accordingly, the structure 100 is readily manufacturable and can be scaled down to the 10 nm technology node and beyond.

Although the invention has been described by reference to specific embodiments, it should be understood that numerous changes may be made within the spirit and scope of the inventive concepts described. Accordingly, it is intended that the invention not be limited to the described embodiments, but that it have the full scope defined by the language of the following claims.

What is claimed is:

1. A method comprising:
providing a structure having a FinFET disposed in an Rx region, the FinFET including a channel disposed between a pair of source/drain (S/D) regions and a gate (CB) disposed over the channel, the gate including gate metal disposed between gate spacers;
forming a cap over the gate, the cap having an outer liner disposed around an inner core;
forming trench silicide (TS) layers on opposing sides of the gate over the S/D regions;
recessing the TS layers to a level above a level of the gate and below a level of the inner core;
etching the outer liner down to a level proximate the level of the TS layers;
disposing an oxide layer over the structure;
patterning a CB trench into the oxide layer to expose the inner core at a shelf portion of the CB trench, the CB trench located within the Rx region;
etching the inner core to further extend the CB trench to a trench bottom and to expose the gate metal, the shelf portion of the CB trench having a larger area than the trench bottom; and
metallizing the CB trench to form a CB contact electrically connected to the gate metal.

2. The method of claim 1 wherein the cap outer liner has a first material composition and the cap inner core has a second material composition different from the first material composition.

3. The method of claim 2 wherein the first material and second material are nitrides.

4. The method of claim 2 wherein the second material is one of SiBCN and SiCO.

5. The method of claim 1 wherein the shelf portion of the CB trench is located a sufficient distance from any TS layers to substantially prevent electrical shorting between the CB contact and the TS layers within the Rx region.

6. The method of claim 1 comprising recessing the TS layers to a level that is within a range of 25 to 50 percent of the level of the inner core.

7. The method of claim 1 comprising recessing the TS layers within a range of 15 to 30 nm below the level of the inner core.

8. The method of claim 1 comprising disposing a pair of source/drain (CA) contacts for the FinFET within oxide layer, the CA contacts electrically connecting to the TS layers overlaying the S/D regions of the FinFET, the CA contacts located a sufficient distance away from the CB contact in a direction parallel to the gate to substantially prevent electrical shorting between the CB contact and the CA contacts.

9. The method of claim 8 comprising:
patterning a pair of CA trenches into the oxide layer to expose the TS layers over the S/D regions of the FinFET; and
metallizing the CA trenches to form the CA contacts electrically connected to the TS layers.

10. The method of claim 1 comprising:
disposing a dielectric layer on opposing sides of the gate prior to forming the cap;
recessing the gate below a level of the dielectric layer;
disposing a liner layer over the structure, the liner layer having a first material composition;
disposing a core layer over the liner layer, the core layer having a second material composition different from the first material composition;
polishing the core layer and liner layer down to the level of the dielectric layer to form the outer liner and inner core of the cap;
removing of the dielectric layer to form TS trenches; and
forming the TS layer within the TS trenches.

11. A semiconductor structure comprising:
a FinFET disposed in an Rx region, the FinFET including a channel disposed between a pair of source/drain (S/D) regions and a gate disposed over the channel, the gate including gate metal disposed between gate spacers;
a cap including a cap liner disposed over the gate and a cap core disposed on the cap liner, the cap core extending upwards from the cap liner;
trench silicide (TS) layers disposed on opposing sides of the gate over the S/D regions, the TS layers having a level above a level of the gate and below a level of the cap core;
an oxide layer disposed over the structure;
a CB trench disposed within the oxide layer and over the Rx region, the CB trench extending down to a trench shelf portion located at substantially the level of the cap core and further extending from the shelf portion to a trench bottom, the trench bottom including the gate metal, the shelf portion of the CB trench having a larger area than an area of the trench bottom; and
a CB contact disposed within the CB trench and electrically connected to the gate metal.

12. The semiconductor structure of claim 11 wherein the cap liner has a first material composition and the cap core has a second material composition different from the first material composition.

13. The semiconductor structure of claim 12 wherein the first material and second material are nitrides.

14. The semiconductor structure of claim 12 wherein the second material is one of SiBCN and SiCO.

15. The semiconductor structure of claim 11 wherein the shelf portion of the CB trench is located a sufficient distance from any TS layers to substantially prevent electrical shorting between the CB contact and the TS layers within the Rx region.

16. The semiconductor structure of claim 11 comprising the TS layers having a level that is within a range of 25 to 50 percent of the level of the cap core.

17. The semiconductor structure of claim 11 comprising the TS layers having a level that is within a range of 15 to 30 nm below the level of the cap core.

18. The semiconductor structure of claim 11 comprising a pair of source/drain (CA) contacts for the FinFET being disposed within oxide layer, the CA contacts electrically connecting to the TS layers overlaying the S/D regions of the FinFET, the CA contacts located a sufficient distance away from the CB contact in a direction parallel to the gate to substantially prevent electrical shorting between the CB contact and the CA contacts.

19. The semiconductor structure of claim 11 comprising the shelf portion of the CB trench having an area that is more than 50% larger than the area of the trench bottom.

20. The semiconductor structure of claim 11 comprising:
the Rx region including a plurality of fins extending perpendicular to the gate;
a plurality of FinFETs disposed in the fins, each FinFET including a channel disposed between a pair of S/D regions, wherein the gate is disposed over the channels of each FinFET; and
the TS layers disposed on opposing sides of the gate over the S/D regions of each FinFET.

* * * * *